United States Patent
Kushida (10) Patent No.: US 8,000,130 B2
(45) Date of Patent: Aug. 16, 2011

(54) SEMICONDUCTOR MEMORY DEVICE WITH SENSE CIRCUIT CONNECTED TO SENSE NODE COUPLED TO BIT LINE

(75) Inventor: Keiichi Kushida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 303 days.

(21) Appl. No.: 12/332,569

(22) Filed: Dec. 11, 2008

(65) Prior Publication Data

US 2009/0161411 A1 Jun. 25, 2009

(30) Foreign Application Priority Data

Dec. 25, 2007 (JP) ................................. 2007-331688

(51) Int. Cl.
*G11C 11/00* (2006.01)

(52) U.S. Cl. ........................................ 365/154; 365/207

(58) Field of Classification Search .................. 365/154, 365/207, 208, 205
See application file for complete search history.

(56) References Cited

U.S. PATENT DOCUMENTS

| | | | | |
|---|---|---|---|---|
| 4,507,759 A | * | 3/1985 | Yasui et al. | ................... 365/154 |
| 5,850,359 A | * | 12/1998 | Liu | ................... 365/156 |
| 7,724,565 B2 | * | 5/2010 | Barth et al. | ................... 365/154 |
| 2008/0084781 A1 | * | 4/2008 | Piorkowski | ................... 365/233.1 |

OTHER PUBLICATIONS

John Wuu, et al., 'The Asynchronous 24MB On-Chip Level-3 Cache for a Dual-Core Itanium°-Family Processor, IEEE International Solid-State Circuits Conference, Session 26, 2005, pp. 488-489 and 618.

* cited by examiner

*Primary Examiner* — Vu A Le
(74) *Attorney, Agent, or Firm* — Oblon, Spivak, McClelland, Maier & Neustadt, L.L.P.

(57) ABSTRACT

A semiconductor memory device comprises a word line; a bit line crossing the word line; a memory cell connected to intersection of the word line and the bit line; and a sense circuit connected to sense node coupled to the bit line. The sense circuit includes a first transistor of the first conduction type having a gate connected to the sense node, a second transistor of the second conduction type having a source connected to a first power supply, a drain connected to the sense node, and a gate connected to the drain of the first transistor, a third transistor having a source connected to the first power supply, a drain connected to the drain of the first transistor, and a gate connected to a control signal line, and a fourth transistor having a source connected to a second power supply, a drain connected to the source of the first transistor, and a gate connected to the control signal line. The sense circuit is activated with a control signal given to the control signal line.

20 Claims, 6 Drawing Sheets

SEMICONDUCTOR MEMORY DEVICE WITH SENSE CIRCUIT CONNECTED TO SENSE NODE COUPLED TO BIT LINE

CROSS-REFERENCE TO RELATED APPLICATION

This application is based upon and claims the benefit of priority from the prior Japanese Patent Application No. 2007-331688, filed on Dec. 25, 2007, the entire contents of which are incorporated herein by reference.

BACKGROUND OF THE INVENTION

1. Field of the Invention

The present invention relates to a semiconductor memory device such as an SRAM.

2. Description of the Related Art

Recently, technologies for lowering operating voltages and achieving high speed operation in the SRAM have been developed progressively and various prior art technologies have been proposed to improve the cell disturb characteristic. One is associated with an SRAM having a hierarchical bit-line structure with less memory cells per bit line to reduce the bit-line capacity (Non-patent Document 1: John Wuu et. al., 2005 IEEE International Solid-State Circuits Conference, pp. 488-489, 618). Data reading in the SRAM is executed as follows. A precharge circuit is used to precharge a pair of bit lines to "H" level and one of the paired bit lines is connected to a cell node at "L" level in a selected memory cell, thereby lowering the one bit line from "H" level to "L" level. This operation is transferred to the sense node through a column gate and amplified at a sense circuit connected to the sense node and provided to external. Thus, data reading can be achieved.

In the above operation, however, when the voltage on the bit line lowers by the threshold than the gate voltage on the column gate, the column gate turns on. Thus, the bit line is connected to the sense node and influenced by the capacity on the sense node. In accordance with this influence, the rate of lowering the voltage on the bit line is decreased. In this case, the bit line voltage on the selected memory cell does not lower sufficiently and causes deterioration of the disturb characteristic of the memory cell.

SUMMARY OF THE INVENTION

In a first aspect the present invention provides a semiconductor memory device, comprising: a word line; a bit line crossing the word line; a memory cell connected to intersection of the word line and the bit line; and a sense circuit connected to sense node coupled to the bit line, the sense circuit including a first transistor of the first conduction type having a gate connected to the sense node, a second transistor of the second conduction type having a source connected to a first power supply, a drain connected to the sense node, and a gate connected to the drain of the first transistor, a third transistor of the second conduction type having a source connected to the first power supply, a drain connected to the drain of the first transistor, and a gate connected to a control signal line, and a fourth transistor of the first conduction type having a source connected to a second power supply, a drain connected to the source of the first transistor, and a gate connected to the control signal line, wherein the sense circuit is activated with a control signal given to the control signal line.

In a second aspect the present invention provides a semiconductor memory device, comprising: a plurality of word lines; a plurality of bit line pairs each including a first and a second bit line crossing the word lines; a plurality of memory cells connected to intersections of the word lines and the bit line pairs; a plurality of column gates connected between the bit line pairs and the first and second nodes; and a sense circuit connected between the first and second sense nodes, the sense circuit including a first transistor of the first conduction type having a gate connected to the first sense node, a second transistor of the second conduction type having a source connected to a first power supply, a drain connected to the first sense node, and a gate connected to the drain of the first transistor, a third transistor of the second conduction type having a source connected to the first power supply, a drain connected to the drain of the first transistor, and a gate connected to a control signal line, a fourth transistor of the first conduction type having a source connected to a second power supply, a drain connected to the source of the first transistor, and a gate connected to the control signal line, a fifth transistor of the first conduction type having a source connected to the drain of the fourth transistor, and a gate connected to the second sense node, a sixth transistor of the second conduction type having a source connected to the first power supply, a drain connected to the second sense node, and a gate connected to the drain of the fifth transistor, and a seventh transistor of the second conduction type having a source connected to the first power supply, a drain connected to the drain of the fifth transistor, and a gate connected to the control signal line, wherein the sense circuit is activated with a control signal given to the control signal line.

In a third aspect the present invention provides a semiconductor memory device, comprising: a plurality of word lines; a plurality of bit line pairs each including a first and a second bit line crossing the word lines; a plurality of memory cells connected to intersections of the word lines and the bit line pairs; a plurality of column gates connected between the bit line pairs; and a sense circuit connected between the first and second sense nodes and activated when the paired bit lines are connected via the column gates to the first and second sense nodes, and operative to amplify the reduction in level lowering from "H" level to "L" level on one sense node of the first and second sense nodes.

DETAILED DESCRIPTION OF THE EMBODIMENTS

The embodiments associated with the semiconductor memory device according to the present invention will now be described in detail with reference to the drawings.

First Embodiment

Figure 1:
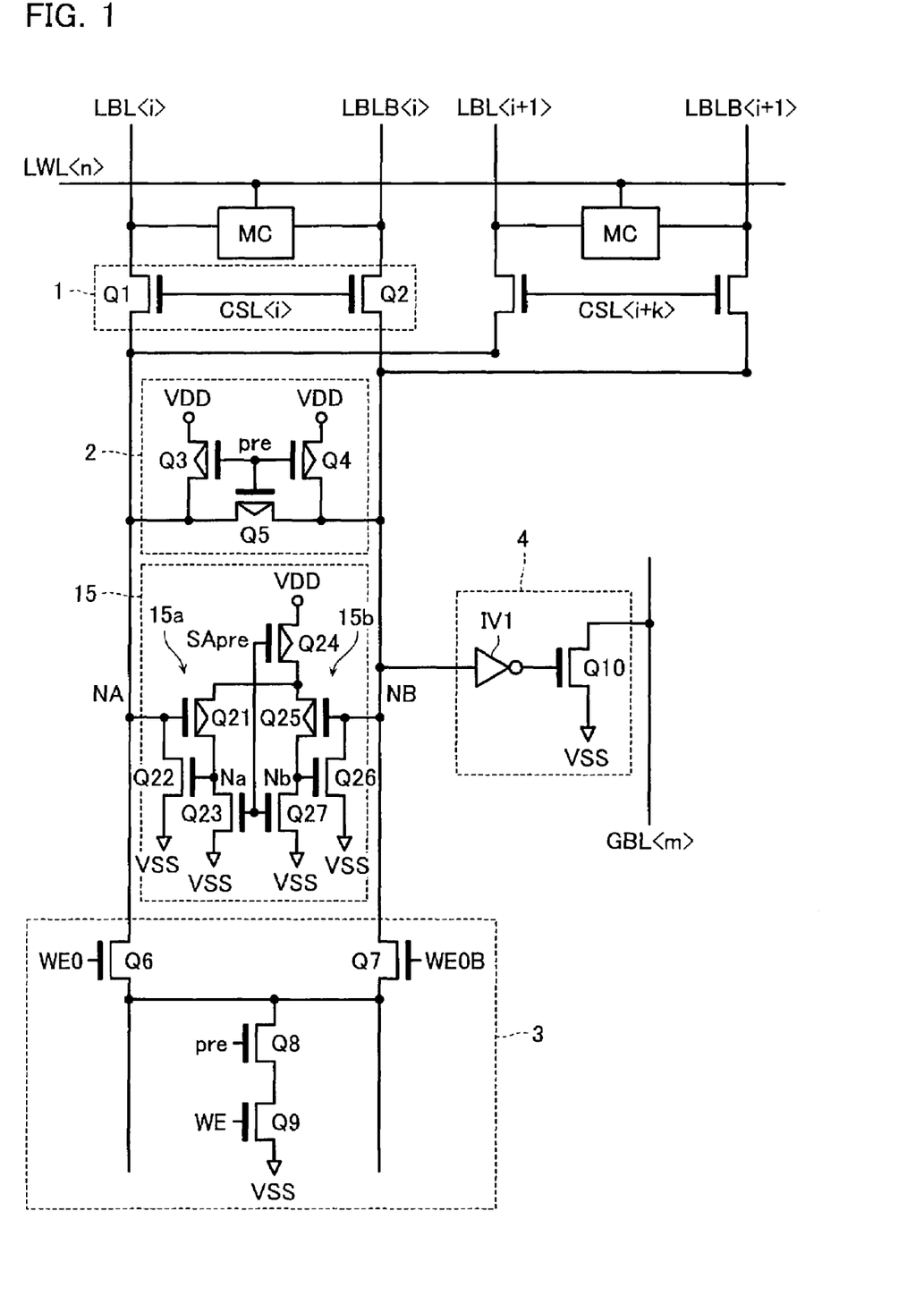
FIG. 1 is a circuit diagram of a semiconductor memory device according to a first embodiment of the present invention.

FIG. 1 is a circuit diagram of a semiconductor memory device according to a first embodiment of the present invention.

The semiconductor memory device according to the present embodiment comprises local word lines LWL, bit lines pairs each including a first local bit line LBL and a second local bit line LBLB crossing the local word lines LWL, and memory cells MC connected at intersections thereof. The paired bit lines are connected to first and second sense nodes NA and NB via a column gate 1 including two NMOS transistors Q1 and Q2. A precharge circuit 2, a sense circuit 15 and a write circuit 3 are connected between the sense nodes NA and NB, and an output circuit 4 is connected to the sense node NB.

Figure 2:
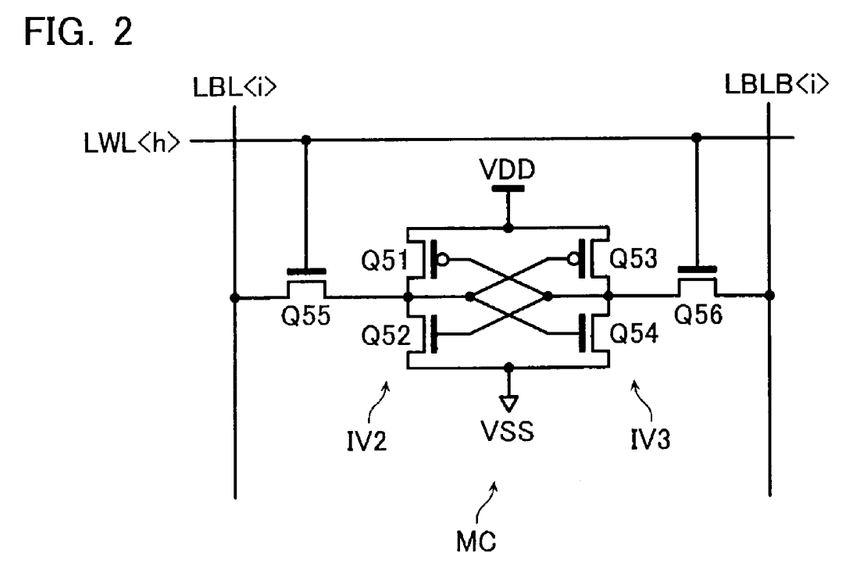
FIG. 2 is a circuit diagram showing a memory cell of the 6-transistor type in the same semiconductor memory device.

The memory cell MC may comprise a memory cell of the 6-transistor type as shown in FIG. 2. Namely, the memory cell of the 6-transistor type comprises a second inverter IV2 including a PMOS transistor Q51 and an NMOS transistor Q52 complementarily connected and having sources connected to the supply terminal VDD and the ground terminal VSS, respectively. It also comprises a third inverter IV3 including a PMOS transistor Q53 and an NMOS transistor Q54 complementarily connected and having sources connected to the supply terminal VDD and the ground terminal VSS, respectively. The inverters IV2, IV3 have respective inputs and outputs mutually connected. A first transfer transistor Q55 is connected between the local bit line LBL and the output terminal of the second inverter IV2. A second transfer transistor Q56 is connected between the local bit line LBLB and the output terminal of the third inverter IV3. The first and second transfer transistors Q55, Q56 have respective gates connected to the local word line LWL. Writing (programming) in the memory cell of the 6-transistor type is executed with both the local bit lines LBL, LBLB while reading may be executed as single-ended reading from only the one local bit line LBL.

The precharge circuit 2 comprises three transistors of the first conduction type or PMOS transistors Q3, Q4, Q5 connected between the supply terminal VDD and the sense node NA, between the supply terminal VDD and the sense node NB and between the sense nodes NA and NB, respectively, and having gates supplied with a precharge signal, pre. It is used to previously precharge the sense nodes NA and NB up to "H" level on getting access to the memory cell MC. The precharge circuit 2 is controlled by a negative logic precharge signal, pre, and activated when it is at "L" level.

The sense circuit 15 comprises first and second sense circuits 15a and 15b corresponding to the sense nodes NA and NB. The first sense circuit 15a includes a first transistor of the first conduction type or a PMOS transistor Q21, and second and third transistors of the second conduction type or NMOS transistors Q22 and Q23. The gate of the PMOS transistor Q21 and the drain of the NMOS transistor Q22 are connected to the sense node NA. The drain of the PMOS transistor Q21 and the gate of the NMOS transistor Q22 are connected to the drain of the NMOS transistor Q23. The source of the PMOS transistor Q21 is connected to the supply terminal VDD via a fourth transistor of the first conduction type or a PMOS transistor Q24. The sources of the NMOS transistors Q22 and Q23 are connected to the ground terminal VSS. Similarly, the second sense circuit 15b includes a fifth transistor of the first conduction type or a PMOS transistor Q25, and sixth and seventh transistors of the second conduction type or NMOS transistors Q26 and Q27. The gate of the PMOS transistor Q25 and the drain of the NMOS transistor Q26 are connected to the sense node NB. The drain of the PMOS transistor Q25 and the gate of the NMOS transistor Q26 are connected to the drain of the NMOS transistor Q27. The source of the PMOS transistors Q25 is connected to the supply terminal VDD via the PMOS transistor Q24 shared by the first sense circuit 15a. The sources of the NMOS transistors Q26 and Q27 are connected to the ground terminal VSS. The sense circuit thus configured can be activated with a negative logic, sense circuit control signal SApre fed to the gates of the PMOS transistor Q24 and the NMOS transistors Q23 and Q27.

The write circuit 3 comprises four transistors of the second conduction type or NMOS transistors Q6, Q7, Q8 and Q9. The write circuit 3 can be activated when the precharge signal is at "L" level and a negative logic, write enable signal WE is at "L" level. This circuit uses first and second write control signals WE0 and WE0B to select one of the sense nodes NA and NB previously precharged to "H" level, and connect the selected sense node to the ground level via NMOS transistors Q8 and Q9 to pull it down to "L" level.

The output circuit 4 comprises an inverter IV1 having an input terminal coupled to the sense node NB, and an NMOS transistor Q10 having a gate supplied with the output from the inverter IV1. It is a circuit to transfer the level on the sense node NB to the global bit line GBL. When the sense node NB is at "L" level, the output from the inverter IV1 is at "H" level, which turns on the NMOS transistor Q10. In this case, the global bit line GBL previously precharged to "H" level is connected to the ground terminal VSS and accordingly pulled down to "L" level, like the sense node NB.

Data reading in the semiconductor memory device thus configured is described below.

In this description, the memory cell MC is assumed to hold "H" level on a cell node close to the sense node NA and "L" level on a cell node close to the sense node NB.

Figure 3:
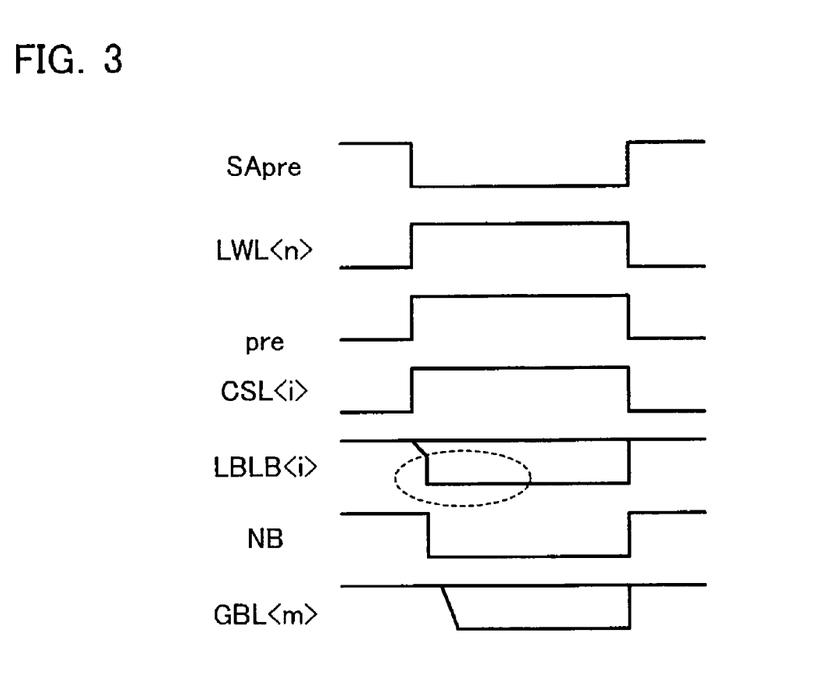
FIG. 3 shows signal levels at the time of reading in the same semiconductor memory device.

FIG. 3 shows signal levels at the time of data reading in the semiconductor memory device according to the present embodiment.

Before the local wordline LWL is selected (LWL="L" level), the precharge signal, pre, is at "L" level. Accordingly, the precharge circuit 2 is activated and the sense nodes NA and NB are precharged to "H" level.

The sense circuit control signal SApre is at "H" level. Accordingly, the sense circuit 15 is inactivated and internal nodes Na and Nb are at "L" level.

Next, the local word line LWL is selected (LWL="H" level), and the column gate control signal CSL and the precharge signal, pre, are turned to "H" level while the sense circuit control signal SApre is turned to "L" level. As a result, the drive NMOS transistor Q54 in the memory cell MC turns on first to pull down the local bit line LBLB toward "L" level. Subsequently, when the level on the local bit line LBLB lowers below the threshold of the NMOS transistor Q2 in the column gate 1, the NMOS transistor Q2 turns on and pulls down the sense node NB to "L" level, thus the PMOS transistor Q25 turns on. In this case, the PMOS transistor Q24 is kept on and accordingly the cell node Nb is turned to "H" level, which turns on the NMOS transistor Q26. Therefore, the potential on the local bit line LBLB is sharply pulled down to "L" level via the cell node NB and the NMOS transistor Q26.

Thus, the input of the inverter IV1 is turned to "L" level and the output to "H" level, which turns on the NMOS transistor Q10. Accordingly, "L" level data is read out onto the global bit line GBL.

Data writing in the memory cell MC is described next.

In this description, it is assumed that "H" level is written in the node in the memory cell MC close to the sense node NA and "L" level in the node close to the sense node NB.

The state before data writing is similar to the state before the local word line LWL is selected at the time of data reading.

First, the precharge signal, pre, is turned to "H" level, the write enable signal WE to "H" level, the write control signal WE0B, for controlling the NMOS transistor Q7 connected to the sense node NB targeted for "L" level write, to "H" level, and the other write control signal WE0 to "L" level. In this case, the write circuit 3 is activated and the sense node NB is connected to the ground terminal VSS and pulled down to "L" level. Therefore, the NMOS transistor Q2 in the column gate 1 is turned on to write data in the memory cell MC. At this time, the sense circuit 15 is kept inactivated.

Figure 4:
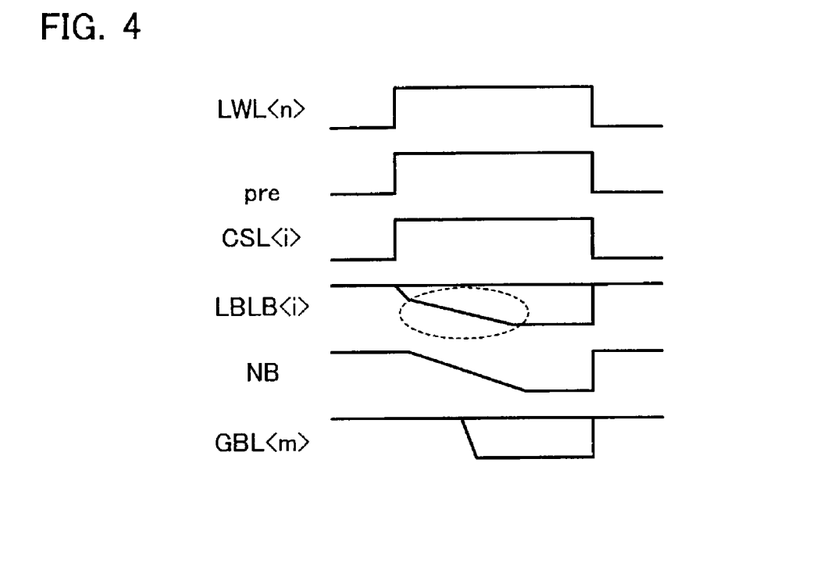
FIG. 4 shows signal levels at the time of data reading in a semiconductor memory device according to a comparison example with no sense circuit.
Figure 5:
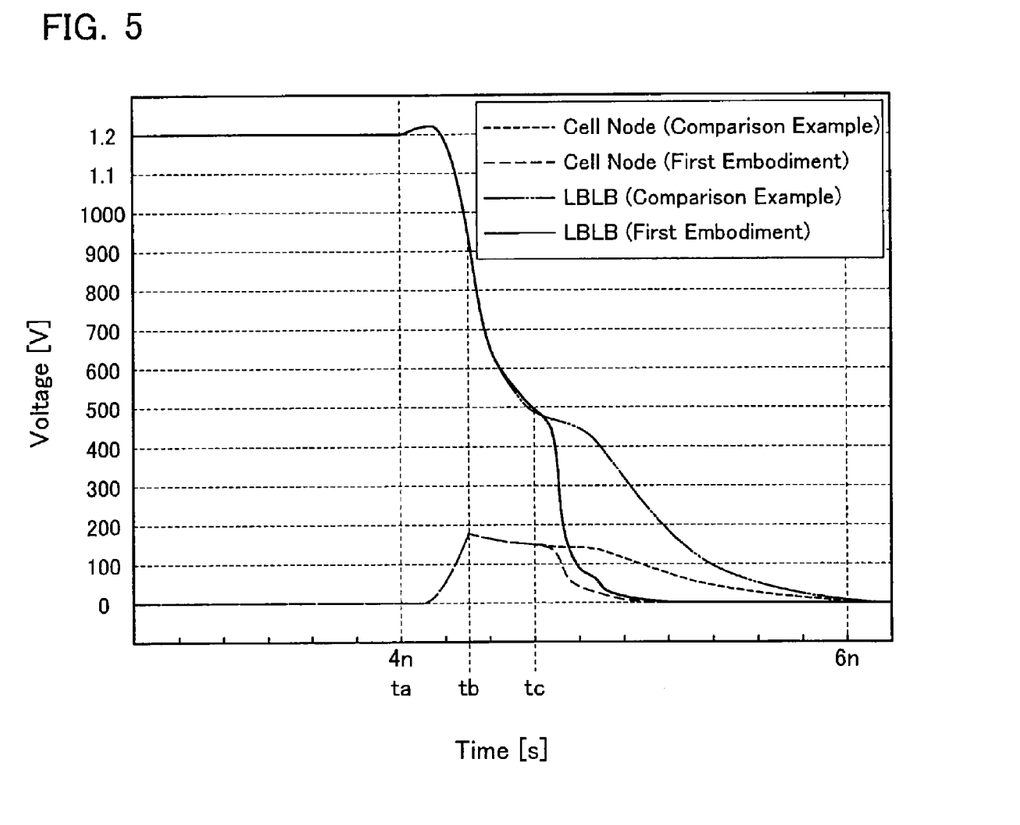
FIG. 5 provides graphs showing relations between time and signal levels on cell nodes and local bit lines in the semiconductor memory device according to the first embodiment and the semiconductor memory device according to the comparison example.

FIG. 4 shows signal levels at the time of data reading in a semiconductor memory device according to a comparison example with no sense circuit 15. FIG. 5 provides graphs detailing the dotted-line portions in FIGS. 3 and 4.

Immediately after the local word line LWL is selected (ta), the local bit lines LBL and LBLB have smaller potential differences from the gates of the NMOS transistors Q1 and Q2 and accordingly the NMOS transistors Q1 and Q2 are cut off. Therefore, without the influence by the column gate capacity, the level on the local bit line LBLB sharply lowers. In contrast, when the cut-off state of the NMOS transistor Q2 is cleared (tc), the influence via the column gate by the capacity on the sense node decreases the rate of lowering the voltage on the local bit line LBLB. In the comparison example, the disturb period is extended in accordance with this influence. On the other hand, in the present embodiment, with the operation of the sense circuit 15, when the level on the sense node NB sharply lowers, the level on the local bit line LBLB also lowers in a feed-back operation.

As for the node in the memory cell MC, the local bit line LBLB precharged to "H" level pulls it up and elevates the level instantaneously immediately after the local word line LWL is selected (ta). In this state, in the comparison example, the influence via the column gate by the capacity on the sense node only allows the signal level to lower gradually. In contrast, in the present embodiment, the NMOS transistor Q26 in the sense circuit 15 allows the level to lower sharply.

As obvious from the foregoing, in the present embodiment the influence by the column gate capacity at the time of column gate release can be prevented from extending the disturb period. The use of the NMOS transistors Q22 and Q26 having larger driving forces in the sense circuit 15 can increase the above-described effect. The driving forces of the NMOS transistors Q22 and Q26 in the sense circuit 15 commonly used by the bit line pairs may be designed larger than those of the NMOS transistors Q52 and Q54 in the memory cell MC. In this case, the resistance to disturb can be improved without causing an increase in circuit area.

Second Embodiment

Figure 6:
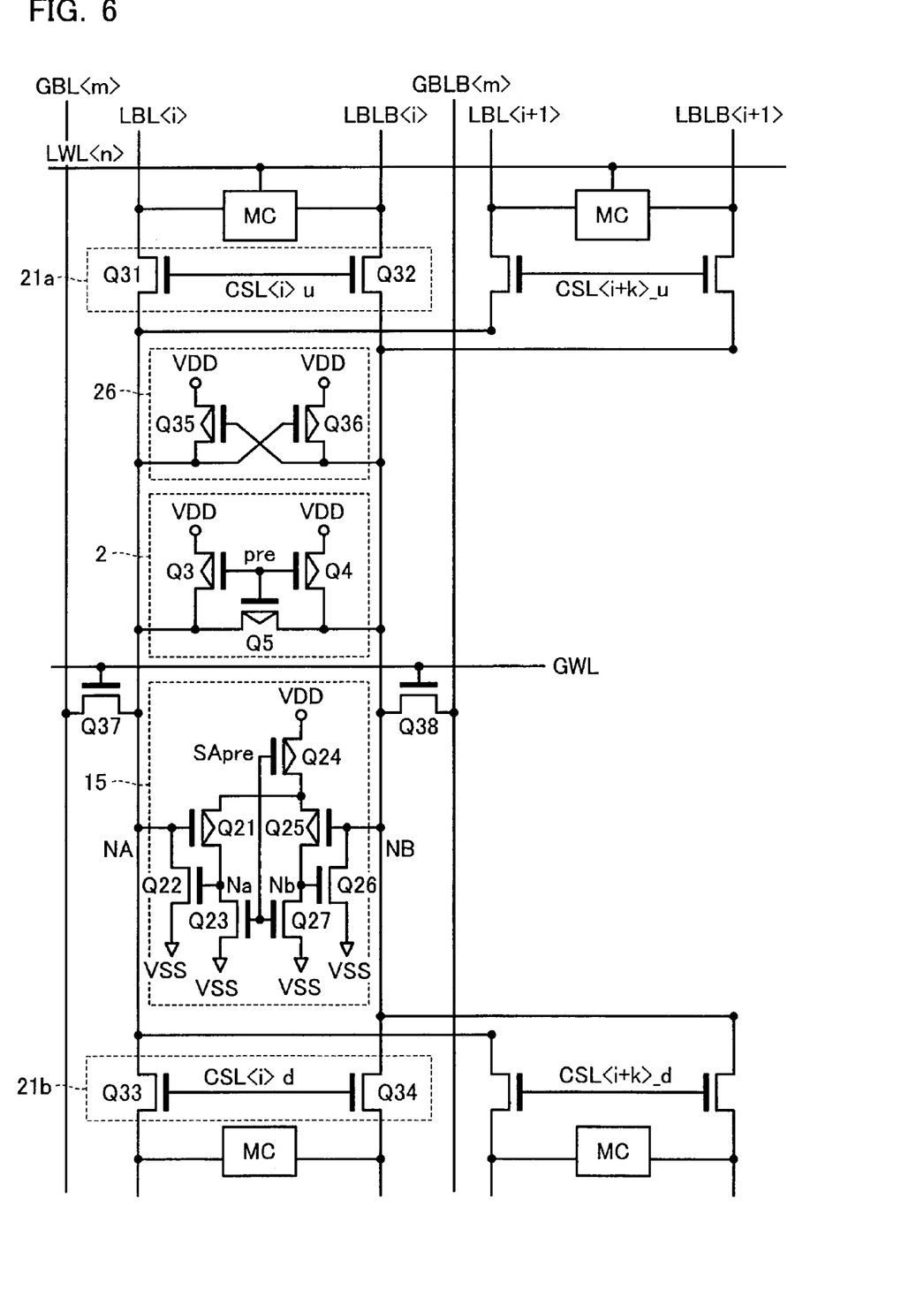
FIG. 6 is a circuit diagram of a semiconductor memory device according to a second embodiment of the present invention.
Figure 7:
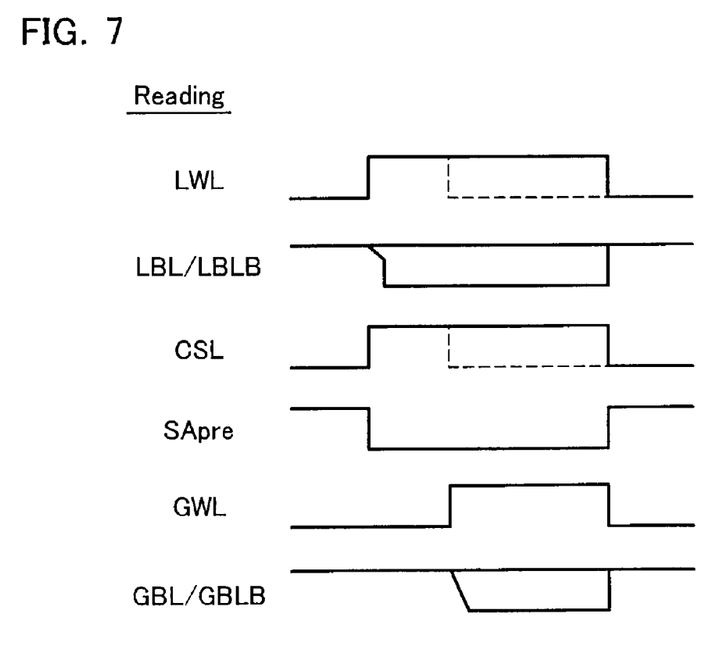
FIG. 7 shows signal levels at the time of reading in the same semiconductor memory device.
Figure 8:
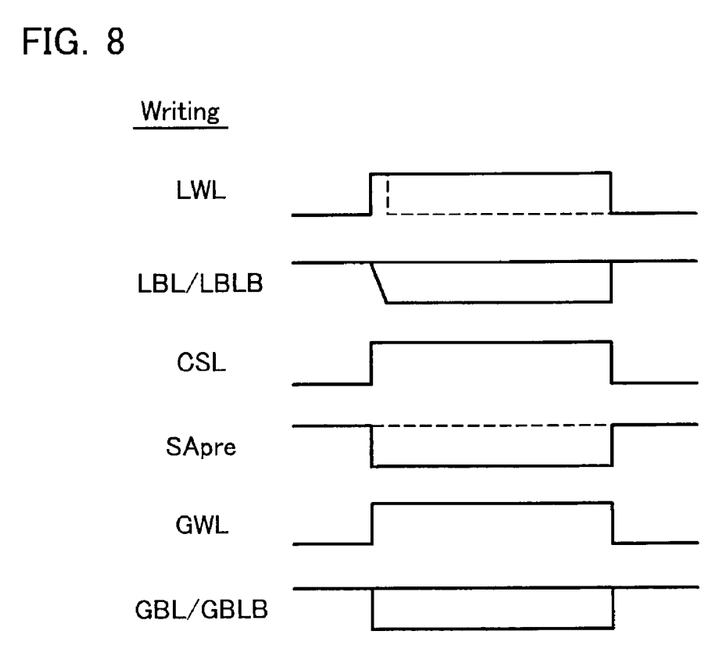
FIG. 8 shows signal levels at the time of writing in the same semiconductor memory device.

FIG. 6 is a circuit diagram of a semiconductor memory device according to a second embodiment of the present invention. FIGS. 7 and 8 show signal levels at the time of data reading and writing in the present embodiment.

In the present embodiment, the sense circuit 15 shown in FIG. 15 is applied to an SRAM having a hierarchical bit-line structure. This arrangement includes several memory cells MC defined as one block, first and second local bit lines LBL and LBLB provided per one block, and first and second global bit lines GBL and GBLB provided per several blocks. A latch circuit 26 including two PMOS transistors Q35 and Q36 is provided between the sense nodes NA and NB to remove the influence by noises.

Data reading in the semiconductor memory device thus configured is described below.

First, the local word line LWL is selected (LWL="H" level). At the same time, the column gate control signal CSL is turned to "H" level and the sense circuit control signal SApre to "L" level. As a result, the data held in the memory cell MC appears on the sense nodes NA and NB via the local bit lines LBL and LBLB as described above. When the block selection signal GWL is turned to "H" level, the data appeared on the sense nodes NA and NB is read out onto the first and second global bit lines GBL and GBLB via NMOS transistors Q37 and Q38.

On the other hand, data writing in the memory cell MC is executed using the sense circuit 15 as a local write assist circuit, different from the preceding embodiment. First, the local word line LWL is selected (LWL="H" level). At the same time, the column gate control signal CSL is turned to "H" level, the sense circuit control signal SApre to "L" level, and the block selection signal GWL to "H" level. In this case, write data held on the first and second global bit lines GBL and GBLB is transferred to the sense nodes NA and NB via the NMOS transistors Q37 and Q38 turned on with the block selection signal GWL, and driven by the sense circuit 15 such that the data appears on the local bit lines LBL and LBLB. Further, the data is latched in the memory cell MC, and thus writing is realized.

Also in the present embodiment, the disturb period can be reduced like in the first embodiment. In the prior art, a differential amplifier is used at the sense node. Therefore, creation of the timing of activating the sense circuit is required. On the contrary, the present embodiment requires no creation of such the timing. Also at the time of data writing, the sense circuit control signal SApre may operate such that the sense circuit 15 serves as a local write assist circuit to enhance the driving force of the write buffer.

Data reading and writing in the present embodiment can be realized even if the signal levels are changed as shown with the dotted lines in FIGS. 7 and 8. Namely, in reading, the levels on the local bit lines LBL and LBLB are read out onto the sense nodes NA and NB. Thereafter, the column gate 21a may be turned off to separate the local bit lines LBL and LBLB from the sense nodes NA and NB and then read out the data onto the global bit lines GBL and GBLB. In writing, once the data is latched in the memory cell MC, the local word line LWL may be inactivated. Alternatively, the sense circuit 15 may not be used if the driver for the memory cell MC has sufficient ability.

Third Embodiment

Figure 9:
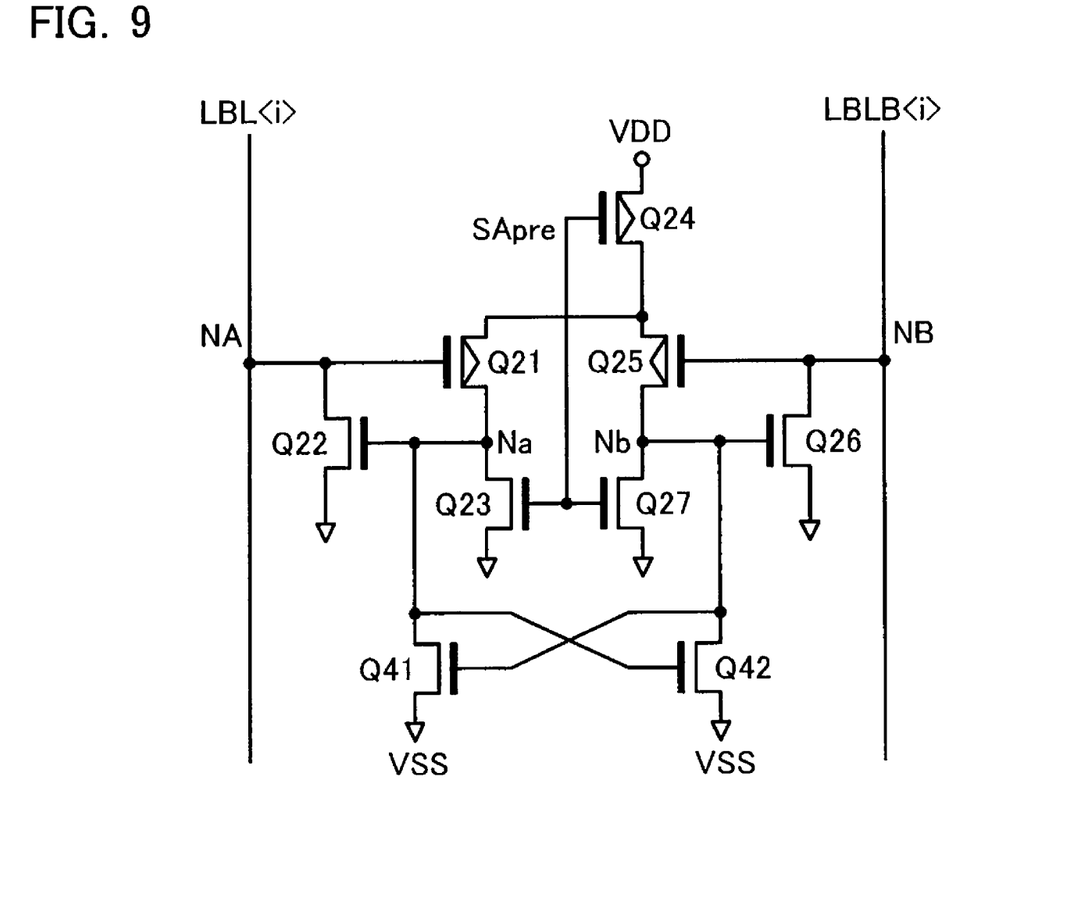
FIG. 9 is a circuit diagram of a sense circuit in a semiconductor memory device according to a third embodiment of the present invention.

FIG. 9 is a circuit diagram of a sense circuit in a semiconductor memory device according to a third embodiment of the present invention.

The sense circuit in the present embodiment includes a latch circuit containing eighth and ninth transistors of the second conduction type or NMOS transistors Q41 and Q42 in addition to the sense circuit 15 in the first and second embodiments.

The NMOS transistor Q41 has a source connected to a second power supply or the ground terminal VSS, a drain to the node Na, and a gate to the node Nb. The NMOS transistor Q42 has a source connected to the ground terminal VSS, a drain to the node Nb, and a gate to the node Na.

In the sense circuit 15 according to the first and second embodiments, when the sense node NA is at "H" level, for example, the PMOS transistor Q21 is turned off and the sense circuit control signal SApre is at "L" level. Therefore, the NMOS transistor Q23 is also turned off. In a word, the node Na is in the floating state. If such the state continues, the circuit is susceptible to noises and leakage current and lacks stability.

On the other hand, in the sense circuit according to the present embodiment, when the sense node NA is at "H" level and the sense node NB at "L" level, for example, the node Nb is connected to VDD via the PMOS transistors Q24 and Q25 turned on. As a result, the NMOS transistor Q41 turns on and connects the node Na to the ground terminal VSS statically.

In a word, the present embodiment makes it possible to prevent the data-latched node Na or Nb from floating and ensure the memory operation with stability.

[Others]

In the above embodiments, the first and second local bit lines LBL and LBLB may be connected not via the column gate 1 but directly to the first and second sense nodes NA and NB. Even in such the case, the action of the sense circuit 15 described above can exert the similar effect as in the case of the connection via the column gate 1.

What is claimed is:

1. A semiconductor memory device, comprising:
    a word line;
    a bit line crossing said word line;
    a memory cell connected to intersection of said word line and said bit line; and
    a sense circuit connected to sense node coupled to said bit line, said sense circuit including
        a first transistor of the first conduction type having a gate connected to said sense node,
        a second transistor of the second conduction type having a source connected to a first power supply, a drain connected to said sense node, and a gate connected to the drain of said first transistor,
        a third transistor of the second conduction type having a source connected to the first power supply, a drain connected to the drain of said first transistor, and a gate connected to a control signal line, and
        a fourth transistor of the first conduction type having a source connected to a second power supply, a drain connected to the source of said first transistor, and a gate connected to said control signal line,
    wherein said sense circuit is activated with a control signal given to said control signal line.

2. The semiconductor memory device according to claim 1, further comprising a column gate connected between said bit lines and said sense node.

3. The semiconductor memory device according to claim 1, further comprising an output circuit connected to said sense node and operative to amplify data appeared on said sense node.

4. The semiconductor memory device according to claim 1, further comprising:
    a global bit line for data input/output; and
    a transfer transistor connected between said sense node and said global bit line.

5. A semiconductor memory device, comprising:
    a plurality of word lines;
    a plurality of bit line pairs each including a first and a second bit line crossing said word lines;
    a plurality of memory cells connected to intersections of said word lines and said bit line pairs;
    a plurality of column gates connected between said bit line pairs and first and second nodes; and
    a sense circuit connected between said first and second sense nodes, said sense circuit including
        a first transistor of the first conduction type having a gate connected to said first sense node,
        a second transistor of the second conduction type having a source connected to a first power supply, a drain connected to said first sense node, and a gate connected to the drain of said first transistor,
        a third transistor of the second conduction type having a source connected to the first power supply, a drain connected to the drain of said first transistor, and a gate connected to a control signal line,
        a fourth transistor of the first conduction type having a source connected to a second power supply, a drain connected to the source of said first transistor, and a gate connected to said control signal line,
        a fifth transistor of the first conduction type having a source connected to the drain of said fourth transistor, and a gate connected to said second sense node,
        a sixth transistor of the second conduction type having a source connected to the first power supply, a drain connected to said second sense node, and a gate connected to the drain of said fifth transistor, and
        a seventh transistor of the second conduction type having a source connected to the first power supply, a drain connected to the drain of said fifth transistor, and a gate connected to said control signal line,
    wherein said sense circuit is activated with a control signal given to said control signal line.

6. The semiconductor memory device according to claim 5, said sense circuit further including
    an eighth transistor of the second conduction type having a source connected to the first power supply, a drain connected to the drain of said first transistor, and a gate connected to the drain of said fifth transistor, and
    a ninth transistor of the second conduction type having a source connected to the first power supply, a drain connected to the drain of said fifth transistor, and a gate connected to the drain of said first transistor.

7. The semiconductor memory device according to claim 5, further comprising an output circuit connected to one of said first and second sense nodes and operative to amplify data appeared on said sense node.

8. The semiconductor memory device according to claim 5, further comprising a write circuit connected to said first and second sense nodes and operative to provide said first and second sense nodes with data to be written in said memory cell.

9. The semiconductor memory device according to claim 5, wherein plural memory cells connected to said bit line pair configure a block,
    wherein said bit line pairs in plural such blocks are alternatively connected via said column gates to said first and second sense nodes in common.

10. The semiconductor memory device according to claim 9, wherein said plural blocks include a pair of global bit lines, wherein said pair of global bit lines are connected via respective transfer gates to said first and second sense nodes.

11. The semiconductor memory device according to claim 7, further comprising a plurality of global bit lines for data input/output, said output circuit including
a first inverter having an input connected to one of said first and second sense nodes, and
a transistor of the second conduction type arranged between said global bit line and the first power supply and operative to drive said global bit line under control of the output from said first inverter.

12. The semiconductor memory device according to claim 5, wherein said memory cell is arranged between the first power supply and the second power supply, said memory cell including
a first and a second inverter each including a load transistor of the first conduction type and a drive transistor of the second conduction type, and
two transfer gates arranged between said first and second inverters and the first and second bit lines respectively and having gates connected to said word line,
wherein the input and output of the first inverter are connected to the output and input of the second inverter correspondingly.

13. The semiconductor memory device according to claim 12, wherein said second and sixth transistors in said sense circuit have larger driving forces than said drive transistors of the second conduction type in said first and second inverters, respectively.

14. The semiconductor memory device according to claim 5, further comprising a latch circuit connected between said first and second sense nodes.

15. A semiconductor memory device, comprising:
a plurality of word lines;
a plurality of bit line pairs each including a first and a second bit line crossing said word lines;
a plurality of memory cells connected to intersections of said word lines and said bit line pairs;
a plurality of column gates connected between said bit line pairs and first and second sense nodes; and
a sense circuit connected between said first and second sense nodes and activated when said paired bit lines are connected via said column gates to said first and second sense nodes, and operative to amplify the reduction in level lowering from "H" level to "L" level on one sense node of said first and second sense nodes, said reduction in level acting as a trigger for amplifying the reduction in level.

16. The semiconductor memory device according to claim 15, wherein said sense circuit including
a first transistor of the first conduction type having a gate connected to said first or second sense node,
a second transistor of the second conduction type having a source connected to a first power supply, a drain connected to said first sense node, and a gate connected to the drain of said first transistor,
a third transistor of the second conduction type having a source connected to the first power supply, a drain connected to the drain of said first transistor, and a gate connected to a control signal line, and
a fourth transistor of the first conduction type having a source connected to a second power supply, a drain connected to the source of said first transistor, and a gate connected to said control signal line,
said sense circuit is activated with a control signal given to said control signal line.

17. The semiconductor memory device according to claim 15, wherein said sense circuit including
a first transistor of the first conduction type having a gate connected to said first sense node,
a second transistor of the second conduction type having a source connected to a first power supply, a drain connected to said first sense node, and a gate connected to the drain of said first transistor,
a third transistor of the second conduction type having a source connected to the first power supply, a drain connected to the drain of said first transistor, and a gate connected to a control signal line,
a fourth transistor of the first conduction type having a source connected to a second power supply, a drain connected to the source of said first transistor, and a gate connected to said control signal line,
a fifth transistor of the first conduction type having a source connected to the drain of said fourth transistor, and a gate connected to said second sense node,
a sixth transistor of the second conduction type having a source connected to the first power supply, a drain connected to said second sense node, and a gate connected to the drain of said fifth transistor, and
a seventh transistor of the second conduction type having a source connected to the first power supply, a drain connected to the drain of said fifth transistor, and a gate connected to said the control line,
said sense circuit is activated with a control signal given to said control signal line.

18. The semiconductor memory device according to claim 15, wherein said memory cell is arranged between the first power supply and the second power supply, said memory cell including
a first and a second inverter each including a load transistor of the first conduction type and a drive transistor of the second conduction type, and
a transfer gate arranged between the output of one of said first and second inverters and said bit line and having a gate connected to said word line,
wherein the input and output of the first inverter are connected to the output and input of the second inverter correspondingly.

19. The semiconductor memory device according to claim 18, wherein
said sense circuit includes:
a first transistor of the first conduction type having a gate connected to said first or second sense node;
a second transistor of the second conduction type having a source connected to a first power supply, a drain connected to said sense node, and a gate connected to the drain of said first transistor;
a third transistor of the second conduction type having a source connected to the first power supply, a drain connected to the drain of said first transistor, and a gate connected to a control signal line; and
a fourth transistor of the first conduction type having a source connected to a second power supply, a drain connected to the source of said first transistor, and a gate connected to said control signal line;
said sense circuit is activated with a control signal given to said control signal line, and
said second transistor in said sense circuit has a larger driving force than said drive transistor of the second conduction type in said first and second inverter.

20. The semiconductor memory device according to claim 15, wherein said sense circuit is shared by said bit lines.

* * * * *